US008982660B2

(12) United States Patent
Huang et al.

(10) Patent No.: US 8,982,660 B2
(45) Date of Patent: Mar. 17, 2015

(54) SEMICONDUCTOR MEMORY DEVICE AND METHOD FOR WORD LINE DECODING AND ROUTING

(75) Inventors: Yongchang Huang, Shanghai (CN); Jing Guo, Shanghai (CN); Hua Chen, Shanghai (CN); Jiping Ma, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 254 days.

(21) Appl. No.: 13/571,289

(22) Filed: Aug. 9, 2012

(65) Prior Publication Data

US 2013/0322199 A1 Dec. 5, 2013

(30) Foreign Application Priority Data

May 30, 2012 (CN) .......................... 2012 1 0173803

(51) Int. Cl.
*G11C 8/10* (2006.01)
*G11C 8/14* (2006.01)
*G11C 11/418* (2006.01)

(52) U.S. Cl.
CPC ............... *G11C 11/418* (2013.01); *G11C 8/14* (2013.01)
USPC .................... 365/230.01; 365/230.06; 365/51

(58) Field of Classification Search
CPC ........... G11C 11/418; G11C 8/14; G11C 8/10
USPC ..................... 365/230.01, 230.05, 230.06, 51
See application file for complete search history.

(56) References Cited

U.S. PATENT DOCUMENTS

| 5,561,623 | A | * | 10/1996 | Ema ................................ 365/51 |
| 5,687,108 | A | * | 11/1997 | Proebsting ..................... 365/51 |
| 5,901,105 | A | * | 5/1999 | Ong et al. ................. 365/230.06 |
| 6,088,287 | A | * | 7/2000 | Bill et al. ................. 365/230.06 |
| 6,847,536 | B1 | * | 1/2005 | Lee et al. ......................... 365/51 |
| 2005/0195642 | A1 | * | 9/2005 | Schmitt ......................... 365/154 |

* cited by examiner

*Primary Examiner* — Douglas King
(74) *Attorney, Agent, or Firm* — Zilka-Kotab, PC

(57) ABSTRACT

The invention discloses a semiconductor memory device and a method for word line decoding and routing. The present invention relates generally to semiconductor memory field, Problems solved by the invention is that, to improve the quality of word line signals results in routing congestion. Embodiments of the invention provide the program as follows: a semiconductor memory device and a method for word line decoding and routing, dividing memory array of the semiconductor memory device into a plurality of smaller memory arrays, on a first metal layer routing first decoded row address, on a second metal layer below the first metal layer routing second decoded row address, and the output word line after decoding drives the plurality of smaller memory arrays. Embodiments of the invention are suitable for various semiconductor memory designs, including: on-chip cache, translation look-aside buffer, content addressable memory, ROM, EEPROM, and SRAM and so on.

10 Claims, 3 Drawing Sheets

SEMICONDUCTOR MEMORY DEVICE AND METHOD FOR WORD LINE DECODING AND ROUTING

PRIORITY AND RELATED APPLICATION DATA

The present application claims the priority of Chinese Patent Application No. 201210173803.8, filed on May 30, 2012, which is incorporated herein by reference.

FIELD OF INVENTION

The present invention relates generally to semiconductor memory field, and in particular, to a semiconductor memory device and a method for word line decoding and routing.

BACKGROUND

In today's chips, memory consumes a significant amount of chip area and is always a bottle neck which limits chips to run at lower operation voltage and higher speed. For example, SRAM (static random access memory) always occupies large operation resources and leads to serious metal layer routing congestion problem in P&R (placing and routing) design.

The physical implementation of SRAM in industry generally uses a single-driven mode, i.e. address decoding and driver logic are arranged on one side of a whole memory array, and word line is decoded to output throughout the entire memory array. After the process below 65 nm, RC delay of word line itself has seriously influences the performance and the yield of SRAM. Due to a proportional relationship between RC delay and routing length, circuit design needs that word line of a long distance routing is cut into shorter word line so as to improve the slope and delay of the word line.

In prior art, a center-driven mode is always considered to be used to decrease the word line length, for example, a whole memory array can be divided into two smaller memory arrays, between which routing can be arranged. However, central routing of the center-driven mode is very intensive, the routing design is complex, and common control logic and chip area cannot be used sufficiently. Another implementation of prior art, as shown in FIG. 1, uses a global-driven mode that is based on the center-driven mode. In SRAM 100, word line decoding and routing is performed on a upper metal layer (for example, M5), including pre-decoding by pre-decoder 110 and final-decoding by final decoder 120, and then the output word line, on a metal layer (for example, M3) below M5, drives memory array 141 and memory array 142. Although the global mode solves some problems above mentioned, the upper metal layer becomes very intensive, and because signals of power and ground is also on the upper metal layer, word line needs to be shielded.

In the above-mentioned process, inventor found that the prior art has at least the following problems:

To improve the quality of word line signals results in routing congestion.

SUMMARY OF THE INVENTION

In order to solve the problems of the prior art, the present invention provides a semiconductor memory device and a method for word line decoding and routing, so as to, based on decreasing the routing length, achieve simple routing, to save chip area and decrease parasitic RC.

To achieve the above-mentioned purpose, the embodiments of the invention provide the following solutions:

The embodiments of the invention provide a semiconductor memory device, comprising:

a memory array, wherein the memory array is divided into a plurality of smaller memory array;

a pre-decoder, used to receive row address and perform a first decoding of the row address, wherein the pre-decoder, on a first metal layer, is connected with a row address line to be output after the first decoding;

a final decoder, used to receive the first decoded address and perform a second decoding of the row address, wherein the final decoder is situated between the plurality of smaller memory array, the final decoder is coupled to the memory array via a word line on a second metal layer, which is below the first metal layer, wherein the word line is a row address line to be output after the second decoding.

Preferably, row address to be output after the first decoding by the pre-decoder, is one-hot code.

Preferably, the pre-decoder is multiple.

Preferably, the final decoder is multiple, and the multiple final decoders, via the word line, drive the corresponding multiple smaller memory arrays.

Preferably, the semiconductor device is multi-port semiconductor memory.

Preferably, the semiconductor device is SRAM, DRAM or ROM.

The embodiments of the invention provide a method for word line decoding and routing, wherein the word line is used to drive a memory array of a semiconductor device, wherein the memory array is divided into a plurality of smaller memory array, and the semiconductor device comprises a first metal layer and a second metal layer below the first metal layer, the method comprises:

receiving row address and on the first metal layer routing first decoded row address;

receiving the first decoded address and on the second metal layer routing second decoded row address.

Preferably, the first decoded row address is one-hot code.

Preferably, multiple pre-decoders perform the first decoding.

Preferably, the semiconductor memory device is a multi-port semiconductor memory device.

Preferably, multiple final decoders perform the second decoding, wherein the multiple final decoders, via the word line, drive the corresponding multiple smaller memory arrays.

Embodiments of the present invention provide a semiconductor memory device and a method for word line decoding and routing, which implement the pre-decoding and final pre-decoding routing respectively on different metal layers, so that the routing is simple and the routing length and parasitic RC are decreased. In addition, the address after pre-decoding may be one-hot code, so that the address line after the pre-decoding needs not to be shielded.

The above simplified summary of example embodiments of the invention serves to provide a basic understanding of such embodiments. This summary is not an extensive overview of all contemplated aspects of the invention, and is intended to neither identify key or critical elements of all embodiments nor delineate the scope of any or all embodiments. Its sole purpose is to present some concepts of one or more aspects in a simplified form as a prelude to the more detailed description that follows. To the accomplishment of the foregoing and related ends, the one or more embodiments comprise the features hereinafter fully described and particularly pointed out in the claims. The following description and the annexed drawings set forth in detail certain illustrative features of the one or more embodiments. These features are indicative, however, of but a few of the various ways in which the principles of various aspects of the invention may be employed, and this description is intended to include all such aspects of the invention and their equivalents.

BRIEF DESCRIPTION OF THE DRAWINGS

The accompanying drawings, which are incorporated into and constitute a part of this specification, illustrate one or more example embodiments of the invention and, together with the detailed description serve to explain their principles and implementations.

In the drawings.

DETAILED DESCRIPTION

Reference will now be made in detail to the preferred embodiments of the present invention, examples of which are illustrated in the accompanying drawings. Those skilled in the art will realize that the following description is illustrative only and is not intended to be in any way limiting.

Memory devices according to embodiments of the present invention include, but are not limited to the following types: static random access memory (SRAM), dynamic random access memory (DRAM), synchronous static random access memory (SDRAM), erasable programmable read-only memory (EPROM), electrically erasable programmable read-only memory (EPROM), or Flash memory.

Embodiments of the present invention take SRAM as a illustrative example, and are suitable for other memory devices.

Figure 1:
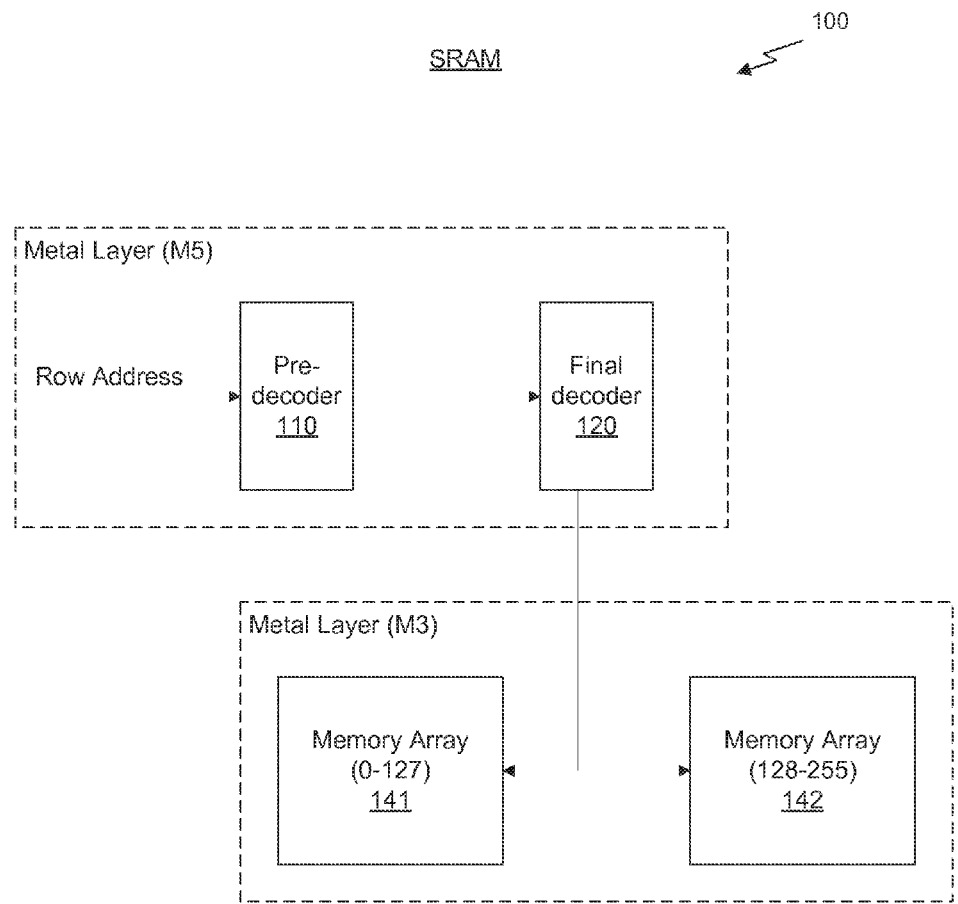
FIG. 1 illustrates a schematic diagram of a semiconductor memory device in prior art.
Figure 2:
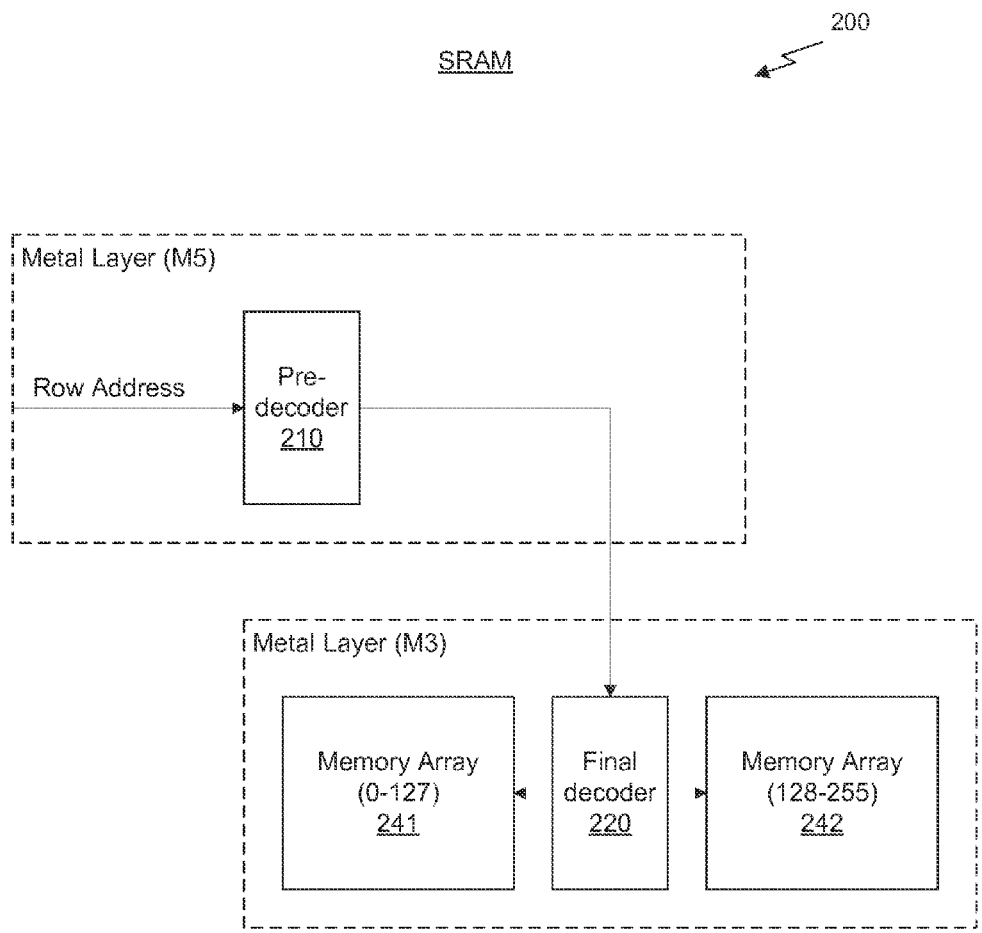
FIG. 2 illustrates a schematic diagram of a semiconductor memory device in accordance with an embodiment of the present invention.
Figure 3:
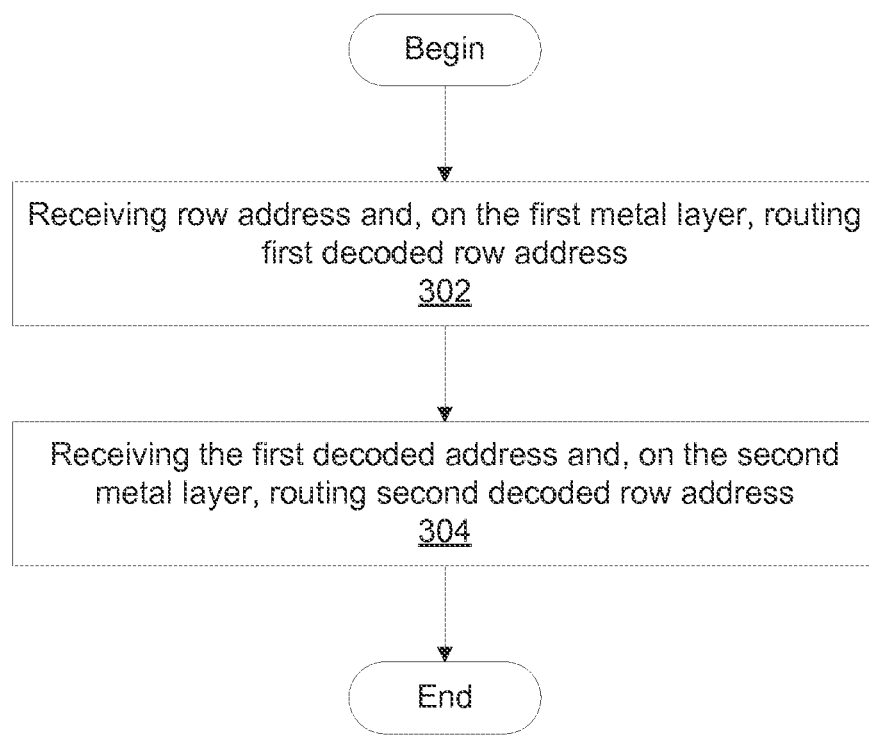
FIG. 3 illustrates a schematic flow chart of a method for word line decoding and routing in accordance with an embodiment of the present invention.

For ease of illustrations, only units used to explain the embodiments of the invention in SRAM is shown. As shown in FIG. 2, SRAM 200 comprises two metal layers, such as respectively M3 and M5, and M5 is on M3. Other metal layers are not shown. It should be noted that, the illustrative accompanying drawings are just for convenience of illustrating the position relationship between M3 and M5, and the position relationship of components of SRAM shown in the figures is not their practical physical position relationship, unless expressly limited by the invention. SRAM 200 comprises a memory array, a pre-decoder 210 and a final decoder 220. Wherein the memory array takes a memory array including **256*256 memory units as an example. The memory array is divided into two smaller memory arrays, respectively to be memory array 241 (0-127) and memory array 242 (128-255). Pre-decoder 210 is used to receive row address and perform a first decoding of the row address. Final decoder 220 is used to receive the first decoded address and perform a second decoding of the row address. In M3, routing first decoded row address, and in M5, routing second decoded row address. The final decoder 220 is coupled to the pre-decoder 210 with a row address line output after the first decoding, and the final decoder 220 is situated between two memory arrays, and coupled to the two smaller memory arrays via the word line that is row address line to be output after the second decoding by final decoder 220. Accordingly, contrary to the global-driven mode in which the completely decoded address by word line is transmit to M5, only pre-decoded address is transmit to the final decoder in M5**.

In another embodiment of the invention, firstly, a 8-bit address is pre-decoded by pre-decoder that including three decoders, respectively two 3-8 pre-decoders and one 2-4 pre-decoder. Accordingly, 8 bit address line, after being pre-decoded by the pre-decoders, becomes 20 address lines. The pre-decoded addresses of each decoder are all one-hot and thus can be routed without shielding adjacently, which minimizes the usage of M5 routing tracks. Then, 20 address lines, after being finally decoded by the final decoder, become 256 word lines. The length of the word line is shorter than it in the global-driven mode. In addition, before entering into the final decoder, 20 address lines via a Nand/nor gate is connected to the final decoder.

Final decoder according to one embodiment of the invention may be multiple, and multiple final decoders perform local decoding, used to respectively drive, via word line, multiple memory arrays corresponding to each final decoder.

In addition, the embodiments of the invention are suitable for multi-port SRAM. In the multi-port SRAM, due to corresponding multiple sets of word line, routing of the word line are more intensive, the routing mode according to the embodiments of the invention is more suitable to multi-port SRAM.

The embodiments of the invention also provides a method for word line decoding and routing, wherein the word line is used to drive a memory array of a semiconductor device, wherein the memory array is divided into a plurality of smaller memory array, and the semiconductor device comprises a first metal layer and a second metal layer below the first metal layer, the method comprises:

Step 302: receiving row address and on the first metal layer routing first decoded row address;

Step 304: receiving the first decoded address and on the second metal layer routing second decoded row address.

Embodiments of the present invention provide a semiconductor memory device and a method for word line decoding and routing, which implement the pre-decoding and the final pre-decoding routing respectively on different metal layers, so that the routing is simple and the routing length and parasitic RC are decreased. In addition, the address after pre-decoding may be one-hot code, so that the address line after the pre-decoding needs not to be shielded.

It should be appreciated that, in the embodiments, the method for word line decoding and routing may refer to the semiconductor memory device, specifically not repeat them herein.

Embodiments of the invention are suitable for various semiconductor memory designs, including: on-chip cache, translation look-aside buffer (TLB), content addressable memory (CAM), ROM, EEPROM, and SRAM and so on.

The present invention has been described through the above-mentioned embodiments. However, it will be understand that the above-mentioned embodiments are for the purpose of demonstration and description and not for the purpose of limiting the present to the scope of the described embodiments. Moreover, those skilled in the art could appreciated that the present invention is not limited to the above mentioned embodiments and that various modifications and adaptations in accordance of the teaching of the present invention may be made within the scope and spirit of the present invention. The protection scope of the present invention is further defined by the following claims.

What is claimed is:

1. A semiconductor memory device, comprising:
a memory array, wherein the memory array is divided into a plurality of smaller memory arrays;
a pre-decoder that receives an n-bit row address and decodes the n-bit row address to generate a first decoded address, wherein the first decoded address includes a number of bits divided into a plurality of portions, each portion encoded according to a one-hot encoding, and wherein the first decoded address is routed on a first metal layer;
a final decoder that receives the first decoded address and decodes the first decoded address to generate a second decoded address that includes a number of word line signals, wherein the final decoder decodes each portion of the first decoded address to generate the second decoded address, and wherein the second decoded address is routed on a second metal layer below the first metal layer.

2. The device of claim 1, wherein each portion of the first decoded address is encoded via a one-hot code.

3. The device of claim 1, wherein the pre-decoder is multiple pre-decoders, each pre-decoder of the multiple pre-decoders is configured to decode a different portion of the n-bit row address into a one-hot code.

4. The device of claim 1, wherein the final decoder is multiple final decoders, and the multiple final decoders, via the word line signals, drive the corresponding multiple smaller memory arrays.

5. The device of claim 1, wherein the semiconductor memory device is a multi-port semiconductor memory.

6. The device of claim 1, wherein the semiconductor memory device comprises at least one of static random access memory (SRAM), dynamic random access memory (DRAM), and read-only memory (ROM).

7. A method comprising:
receiving an n-bit row address;
decoding, via a pre-decoder, the row address to generate a first decoded row address, wherein the first decoded address includes a number of bits divided into a plurality of portions, each portion encoded according to a one-hot encoding, and wherein the first decoded address is routed on a first metal layer;
receiving, at a final decoder, the first decoded row address; and
decoding, via the final decoder, the first decoded row address to generate a second decoded row address that includes a number of word line signals, wherein the final decoder decodes each portion of the first decoded address to generate the second decoded address, and wherein the second decoded address is routed on a second metal layer below the first metal layer.

8. The method of claim 7, wherein each portion of the first decoded row address is encoded via a one-hot code.

9. The method of claim 7, wherein the pre-decoder comprises multiple pre-decoders, each pre-decoder of the multiple pre-decoders is configured to decode a different portion of the n-bit row address into a one-hot code.

10. The method of claim 7, wherein the final decoder comprises multiple final decoders, and the multiple final decoders, via the word line signals, drive the corresponding plurality of smaller memory arrays.

* * * * *